United States Patent
Solomon et al.

(10) Patent No.: US 6,803,266 B2
(45) Date of Patent: Oct. 12, 2004

(54) PROCESS FOR PASSIVATING THE SEMICONDUCTOR-DIELECTRIC INTERFACE OF A MOS DEVICE AND MOS DEVICE FORMED THEREBY

(75) Inventors: Paul M. Solomon, Yorktown Heights, NY (US); Douglas A. Buchanan, Cortland Manor, NY (US); Eduard A. Cartier, New York, NY (US); Kathryn W. Guarini, Yorktown Heights, NY (US); Fenton R. McFeely, Ossing, NY (US); Huiling Shang, Bethlehem, PA (US); John J. Yourkas, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,184

(22) Filed: Mar. 20, 2003

(65) Prior Publication Data

US 2003/0132492 A1 Jul. 17, 2003

Related U.S. Application Data

(62) Division of application No. 09/760,621, filed on Jan. 16, 2001, now Pat. No. 6,603,181.

(51) Int. Cl.[7] .............................................. H01L 21/336
(52) U.S. Cl. ....................... 438/197; 438/585; 438/658; 438/688
(58) Field of Search ................................. 438/197, 585, 438/658, 688, 796, 798

(56) References Cited

U.S. PATENT DOCUMENTS

| | | | | |
|---|---|---|---|---|
| 3,849,204 A | * | 11/1974 | Fowler | 438/475 |
| 3,852,120 A | * | 12/1974 | Johnson et al. | 438/474 |
| 4,952,523 A | * | 8/1990 | Fujii | 438/75 |
| 5,693,961 A | * | 12/1997 | Hamada | 257/66 |
| 5,789,312 A | * | 8/1998 | Buchanan et al. | 438/585 |
| 5,872,387 A | * | 2/1999 | Lyding et al. | 257/607 |

* cited by examiner

Primary Examiner—T. N. Quach
(74) Attorney, Agent, or Firm—Wan Yee Cheung; Gary M. Hartman; Domenica N.S. Hartman

(57) ABSTRACT

A process for passivating the semiconductor-dielectric interface of a MOS structure to reduce the interface state density to a very low level. A particular example is a MOSFET having a tungsten electrode that in the past has prevented passivation of the underlying semiconductor-dielectric interface to an extent sufficient to reduce the interface state density to less than $5 \times 10^{10}/cm^2-eV$. Though substantially impervious to molecular hydrogen, thin tungsten layers are shown to be pervious to atomic hydrogen, enabling atomic hydrogen to be diffused through a tungsten electrode into an underlying semiconductor-dielectric interface. Three general approaches are encompassed: forming an aluminum-tungsten electrode stack in the presence of hydrogen so as to store atomic hydrogen between the tungsten and aluminum layers, followed by an anneal to cause the atomic hydrogen to diffuse through the tungsten layer and into the interface; subjecting a tungsten electrode to hydrogen plasma, during which atomic hydrogen diffuses through the electrode and into the semiconductor-dielectric interface; and implanting atomic hydrogen into tungsten electrode, followed by an anneal to cause the atomic hydrogen to diffuse through the electrode and into the semiconductor-dielectric interface.

20 Claims, 3 Drawing Sheets

PROCESS FOR PASSIVATING THE SEMICONDUCTOR-DIELECTRIC INTERFACE OF A MOS DEVICE AND MOS DEVICE FORMED THEREBY

CROSS REFERENCE TO RELATED APPLICATIONS

This application is a divisional application of U.S. patent application Ser. No. 09/760,621, filed Jan. 16, 2001 now U.S. Pat. No. 6,603,181.

FEDERAL RESEARCH STATEMENT

This invention was made with Government support under Agreement No. N66001-97-1-8908 awarded by DARPA. The Government has certain rights in the invention.

BACKGROUND OF INVENTION

1. Field of the Invention

The present invention generally relates to MOS devices and their fabrication. More particularly, this invention relates to MOS devices that employ metal gate electrodes over ultra-thin gate dielectrics, and to a process for passivating the semiconductor-dielectric interface of such devices by diffusing atomic hydrogen through the metal gate electrode.

2. Description of the Related Art

With the continued scaling of MOSFET (metal-oxide-semiconductor field effect transistors) gate lengths to the tens of nanometers regime, metal gate electrodes have been studied extensively as a substitute for conventional polysilicon gates to eliminate polysilicon gate depletion and to reduce gate resistance. Preferred materials for metal gate electrodes have been those with a midgap workfunction, i.e., a Fermi level midway between the valence and conduction bands of the semiconductor material (e.g., silicon), in order to implement CMOS with slightly doped and undoped channels. For devices with gate lengths well below 0.1 micrometer, a gate material with a midgap workfunction is desirable to permit the use of lightly-doped channels in fully depleted, ultra-thin CMOS-SOI (metal-oxide-semiconductor, silicon-on-insulator) devices. This approach minimizes threshold voltage variations that may occur from device to device as a result of fluctuations in local dopant concentration and film thickness, and increases the carrier mobility from reduced impurity scattering and normal electric fields. Tungsten is one of the most promising candidates for metal gate CMOS technology because of its low resistivity and near ideal midgap workfunction. In addition, the refractivity of tungsten permits process integration in the very early stages of the standard CMOS technology. For deposition on ultra-thin dielectrics, chemical vapor deposition (CVD) has been successfully employed as the method for producing thin, low-resistivity tungsten gate electrodes. Although there have been studies on the performance of tungsten gate MOSFET's, the CVD tungsten gate MOS interface has not been examined in great detail.

For all high performance MOS devices, the passivation of the semiconductor-dielectric interface is important. In the art it is known that, for a MOS capacitor comprising a silicon substrate, silicon dioxide dielectric film and an aluminum electrode, heating the MOS structure to a temperature of about 350° C. to about 500° C. in either a nitrogen or hydrogen environment is able to reduce the Si/SiO$_2$ interface state (trap) density (D$_{ito}$) to very low levels, e.g., less than 5×10$^{10}$/cm$^2$-eV. The effectiveness of aluminum in this process has been attributed to atomic hydrogen produced by the reaction of aluminum with water vapor adsorbed at the Al—SiO$_2$ interface. In theory, atomic hydrogen passivates the Si/SiO$_2$ interface by tying up dangling bonds. In contrast, interface states in polysilicon gate MOS devices can be passivated with forming gas anneal (FGA) treatments using 5 to 10% hydrogen and 90 to 95% nitrogen at temperatures of about 400° C. to about 550° C. However, it has been observed that standard FGA treatments provide very little passivation of a Si/SiO$_2$ interface (e.g., an interface state density below 5×10$^{11}$/cm$^2$-eV) when applied to MOS capacitors with 100 nm thick CVD tungsten gate electrodes. One possible explanation is where a high temperature (e.g., about 500° C. or more) hydrogen-free CVD process has been used, which may effectively eliminate any internal source of hydrogen. Another possibility might lie in the low solubility and diffusivity of hydrogen gas in tungsten, such that a tungsten electrode prevents molecular hydrogen within the surrounding atmosphere from reaching the Si/SiO$_2$ interface during annealing. In any event, the inability to passivate the semiconductor-dielectric interface through a tungsten layer is a potential barrier to the practical use of MOS devices (including capacitors and FET's) with thick tungsten gate electrodes.

From the above, it can be seen that it would be desirable if a process were available to reduce the semiconductor-dielectric (Si/SiO$_2$) interface state density of a MOS device with a thick tungsten gate electrode, particularly if such a process were capable of reducing the interface state density to very low levels (for example, below 5×10$^{10}$/cm$^2$-eV).

SUMMARY OF INVENTION

The present invention provides a process for passivating the semiconductor-dielectric interface of a MOS structure to reduce the interface state density to a very low level. More particularly, the invention is directed to MOS structures that employ a metal layer, and particularly a tungsten layer, that in the past has prevented passivation of an underlying semiconductor-dielectric interface to an extent sufficient to yield an interface state density of less than 5×10$^{10}$/cm$^2$-eV.

The invention generally entails fabricating a MOS device by forming a layer of a suitable dielectric material (such as silicon dioxide) on a silicon-containing semiconductor substrate, such that a semiconductor-dielectric interface is formed between the substrate and the dielectric layer. A metal layer that is pervious to atomic hydrogen is then formed on the dielectric layer to yield a MOS structure. The MOS structure is then exposed to atomic hydrogen in a manner that diffuses the atomic hydrogen through the metal layer and into the interface. The invention encompasses several approaches for introducing atomic hydrogen into the semiconductor-dielectric interface. According to one technique, an aluminum layer is formed on the metal layer in the presence of hydrogen to form a metal stack in which atomic hydrogen is stored between the metal and aluminum layers. The MOS structure is then annealed at a temperature sufficient to cause the atomic hydrogen to diffuse through the metal layer and into the interface. In a second technique, atomic hydrogen is diffused through the metal layer and into the interface by subjecting the metal layer to hydrogen plasma. Another technique is to implant atomic hydrogen into the metal layer, and then anneal the MOS structure at a temperature sufficient to cause the atomic hydrogen to diffuse through the metal layer and into the interface.

According to the invention, sufficient atomic hydrogen is diffused into the semiconductor-dielectric interface to passivate the interface, preferably yielding an interface state density of less than $5\times10^{10}/cm^2$-eV. The process of this invention is particularly beneficial to MOSFET devices that employ metal gates, and particularly tungsten gates, over an ultra-thin gate dielectric, e.g., silicon dioxide at thicknesses of 5 nm or less. Of particular significance to the invention are tungsten layers that are deposited to thicknesses of greater than 20 nm. The present invention determined that such tungsten gates are substantially impervious to molecular hydrogen, thereby preventing the passivation of an underlying semiconductor-dielectric interface by methods employed by the prior art, yet pervious to atomic hydrogen so as to allow passivation in accordance with the techniques of this invention. Consequently, the present invention makes possible MOSFET's with short gate lengths (e.g., on the order of 0.01 micrometer or less) and which make use of tungsten as the gate electrode material, such that the electrode has a midgap workfunction to permit the use of lightly-doped channels in fully depleted, ultra-thin CMOS-SOI devices.

Other objects and advantages of this invention will be better appreciated from the following detailed description.

DETAILED DESCRIPTION

Figure 1:
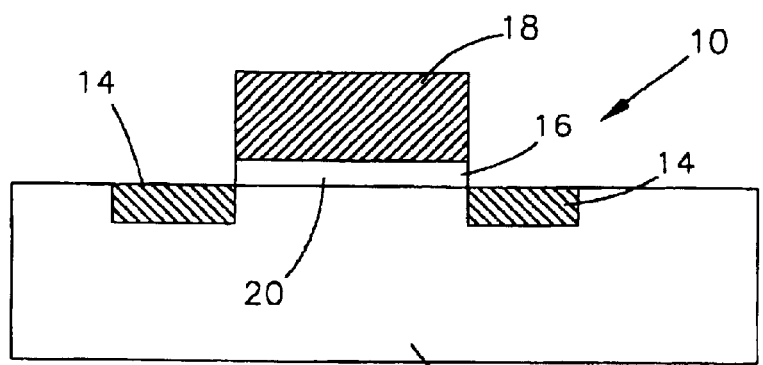
FIG. 1 schematically represents a MOSFET device of a type that can be formed in accordance with the present invention.

FIG. 1 represents a MOSFET device 10 that includes a semiconductor substrate 12, a pair of wells 14 that serve as the source and drain of the device 10, a gate dielectric 16 overlying a channel 20 between the source and drain wells 14, and a gate electrode 18 overlying the gate dielectric 16. While the device 10 represented in FIG. 1 will be used to illustrate and explain the present invention, those skilled in the art will appreciate that the invention is applicable to various other MOS devices having structures that differ from that represented in FIG. 1.

In accordance with conventional practice, the substrate 12 may be formed of various semiconductor materials, though silicon is preferred and the focus of the present invention. Examples of other suitable semiconductor materials include Ge and SiGe alloys, and semiconductor materials such as InGaAs with deposited oxide layers. Silicon dioxide is a preferred material for the gate dielectric 16, though it is foreseeable that other dielectric materials could be used, such as high-k dielectrics including $Y_2O_3$, $La_2O_3$, $Al_2O_3$, $ZnO_2$, $HfO_2$, and mixtures thereof. The substrate 12 and source and drain wells 14 are appropriately doped to be n or p-type as necessary for the particular device 10, and in accordance with known practices. Finally, the gate electrode 18 is formed by a metal layer. Though not necessary for practicing this invention, in a preferred embodiment the MOSFET device 10 is a fully-depleted, ultra-thin CMOS-SOI device, and scaled to have a gate length of less than 0.1 micrometer, more preferably about ten nanometers or less. Furthermore, the metal of the gate electrode 18 preferably has a midgap workfunction to permit the use of an undoped or lightly-doped channel 20, e.g., a doping concentration of not more than about $10^{17}$ $cm^{-2}$. For this purpose, a preferred material for the gate electrode 18 is tungsten, though other suitable gate electrode materials include tungsten and cobalt suicides and tantalum nitride. However, the present invention is generally applicable to gate electrodes formed of essentially any metal that renders the electrode 18 impermeable to molecular hydrogen. Finally, the gate dielectric 16 is preferably ultra-thin, which as used herein refers to thicknesses of about 5 nm or less for a silicon dioxide gate dielectric, and thicknesses of about 20 nm or less for other gate dielectric materials. While the teachings of the invention are particularly well suited for the device 10 as it has been described above, those skilled in the art will appreciate that the teachings of this invention are applicable to other MOS devices formed with other materials.

The present invention is directed to passivating the interface between the semiconductor substrate 12 (at the channel 20) and the gate dielectric 16, whereby the semiconductor-dielectric Interface state (trap) density ($D_{ito}$) is reduced to a very low level, preferably less than $5\times10^{10}/cm^2$-eV. In the past, passivation of an $Si/SiO_2$ interface beneath an aluminum gate electrode has been performed by forming gas annealing (FGA) treatments, typically using a mixture of about 5 to 10% hydrogen and about 90 to 95% nitrogen and annealing temperatures of about 250° C. to about 450° C. It is believed that atomic hydrogen is produced during FGA by the reaction of aluminum with water vapor adsorbed at the Al—$SiO_2$ interface. However, similar FGA treatments of MOS devices with tungsten electrodes of comparable thickness have not resulted in suitable passivation of the $Si/SiO_2$ interface.

In an investigation leading to this invention, tungsten gate MOS capacitors were processed using FGA treatments to evaluate the ability of FGA to passivate a semiconductor-dielectric interface beneath a tungsten layer. Tungsten was deposited by chemical vapor deposition (CVD) performed at a process temperature of about 680° C. and using $W(CO)_6$ as the source material, preferably in accordance with the process disclosed in U.S. Pat. No. 5,789,312 to Buchanan et al., which is incorporated herein by reference. Tungsten was deposited to a thickness of about 100 nm directly on a thermally-grown silicon dioxide layer formed on N-type silicon test wafers (resistivities of about 1 to 2 ohm-cm). The silicon dioxide layers were 4 or 20 nm in thickness, the former being termed "ultra-thin" as used herein. For this investigation, the MOS structure was either defined by conventional photolithography, or defined with a hard etch mask formed by shadow-evaporated aluminum, in which a layer of aluminum remained on the upper surface of the tungsten layer to form an aluminum-tungsten electrode stack. Following fabrication, FGA (5–10% $H_2$/90–95% $N_2$) was performed on each specimen at a temperature of about 350° C. for a duration of about thirty minutes.

Figure 2:
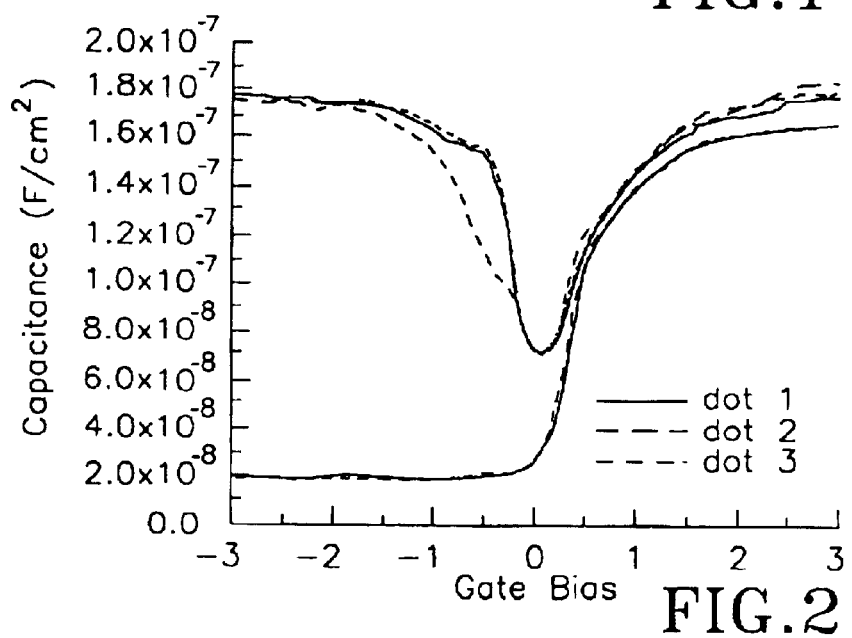
FIGS. 2 and 3 are plots that graphically compare C-V data collected from MOS devices passivated in accordance with, respectively, the prior art and in accordance with a first embodiment of this invention.
Figure 3:
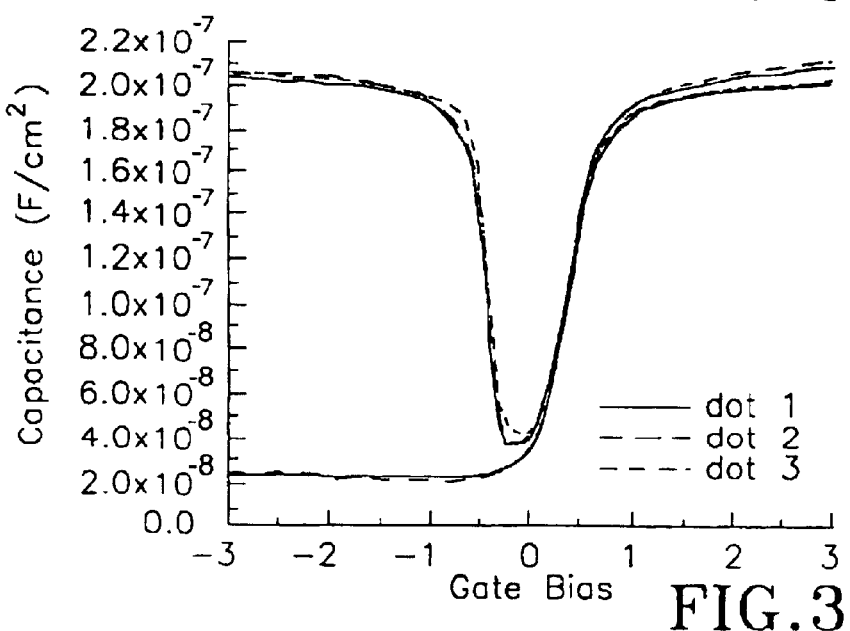

A combination of quasi-static (45 mV/sec) and high frequency (10 KHz) capacitance-voltage (C-V) curves were then obtained through measurements to extract the interface state density using the well-known high-low method, disclosed in M. Kuhn, Solid-State Electronics, Volume 13, pp. 873 (1970). The results for both sets of specimens are represented in FIGS. 2 and 3, which evidence that the passivation of the MOS structures was completely different. In FIG. 3, those specimens with the aluminum-tungsten stack can be seen to be very well passivated, exhibiting interface state densities ($D_{ito}$) in the low $10^{10}/cm^2$-eV range.

In contrast, FIG. 2 evidences that interface state densities of the MOS structures without the aluminum layer were only somewhat passivated after the same FGA treatment, exhibiting interface state densities in the mid-$10^{11}$/cm$^2$-eV range, i.e., very near the interface state density exhibited in the as-deposited condition. The latter results evidenced that a tungsten layer having a thickness of about 100 nm is substantially impervious to molecular hydrogen. Subsequent FGA's performed on the same specimens in the same atmosphere at higher temperatures (such as about 550° C.) were not effective in reducing the interface state density. Instead, an increase in interface state density was actually observed. Further attempts to passivate specimens without an aluminum layer by annealing in atmospheres containing nitrogen, oxygen and water vapor, both together and separately, also failed to substantially passivate their Si/SiO$_2$ interfaces.

FGA treatments were then performed on additional specimens formed to have an aluminum-tungsten electrode stack by annealing in an inert ambient, such as nitrogen. These treatments were carried out at a temperature of about 350° C. for a duration of about thirty minutes, with the result that excellent passivation was again achieved (e.g., interface state densities of about 3×$10^{10}$/cm$^2$-eV). These results strongly suggested that passivating elements were already present in the aluminum-tungsten electrode stack, and that these elements are able to diffuse through a 100 nm-thick layer of tungsten and into an underlying Si/SiO$^2$ interface. Since aluminum is known to be a source of atomic hydrogen by reacting with a monolayer of water vapor adsorbed on surfaces of a MOS structure, it was concluded that the passivating element in each of the specimens equipped with an aluminum-tungsten electrode stack was atomic hydrogen. It was further concluded that atomic hydrogen was somehow stored between the aluminum and tungsten layers of the stack, and that the MOS structure was annealed at a temperature sufficient to cause the atomic hydrogen to diffuse through the tungsten layer and into the Si/SiO$_2$ interface. Suitable temperatures for this purpose are believed to be in the range of about 250° C. to about 400° C., though lower and higher temperatures might also yield acceptable results.

Figure 4:
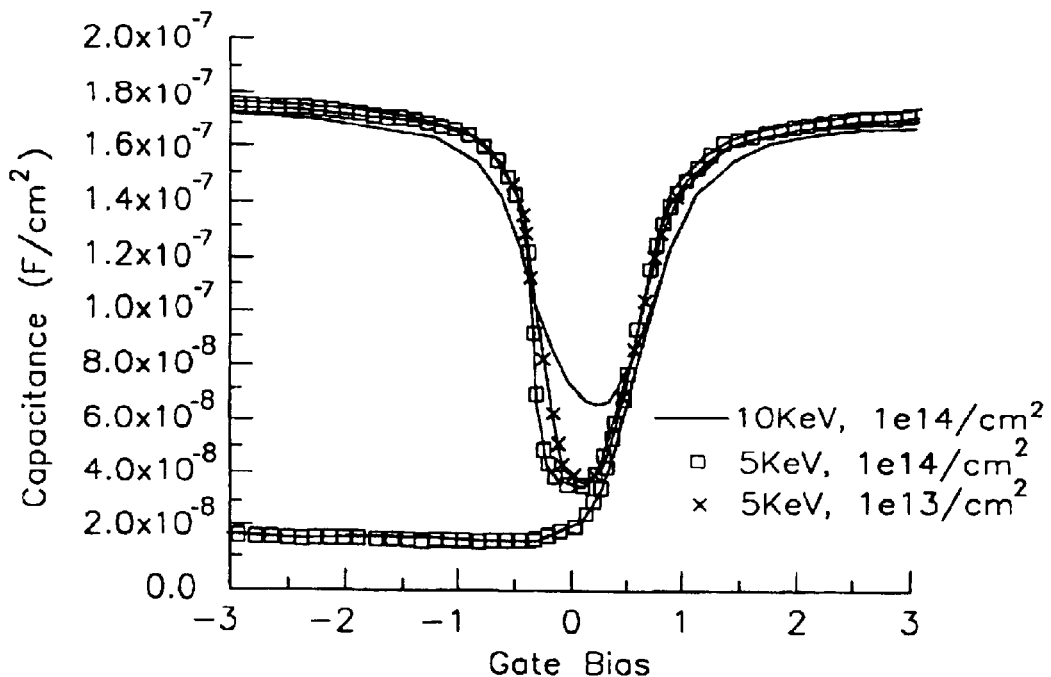
FIG. 4 is a plot of C-V data collected from MOS devices passivated by hydrogen implantation in accordance with a second embodiment of this invention.

On the premise that atomic hydrogen was the passivating element, two additional tests were devised to evaluate MOS structures with tungsten electrodes, but with atomic hydrogen being made available through other sources, namely, implanted hydrogen and hydrogen plasma. In a first of these additional investigations, three samples with tungsten gate capacitors were provided with atomic hydrogen by ion implantation. The capacitors were MOS structures identical to those defined by conventional photolithography in the previous investigation (i.e., 100 nm CVD tungsten without an aluminum overlayer). Two different implant energies were selected to set the implant ranges: 10 KeV with range in tungsten of 535 A and straggle of 300 A, and 5 KeV with range in tungsten of 300 A and straggle of 156 A. Implant range and straggle were determined using implantation simulation software available under the name TRIM from International Business Machines. In addition, two different doses (1×$10^{13}$/cm$^2$ and 1×$10^{14}$/cm$^2$) were used for the 5 KeV samples. The quasi-static and high frequency C-V characteristics for each sample measured as-implanted were severely stretched out for all samples, i.e., characterized by the lack of a sharp and deep drop in the capacitance value, indicative of a very high interface state density. The heavier-dose, deep-implant specimen particularly exhibited a very high interface state density, likely due to implant damage. Following a post metal anneal (PMA) performed at about 350° C. In nitrogen for about 30 minutes, the interface state densities of the specimens were reduced, as evidenced in FIG. 4. The interface state density ($D_{it_0}$) of the sample implanted at 5 KeV with a dose level of 1×$10^{14}$/cm$^2$, was lowered to about 1×$10^{11}$/cm$^2$-eV.

This experiment clearly demonstrated that atomic hydrogen can act as the passivating species. It was theorized that interface state density could be further lowered if the implant energy and dose were optimized. Ideally, implant energy and dose should be chosen so as not to implant atomic hydrogen directly into the dielectric layer and the surrounding semiconductor substrate. On this basis, it is believed that suitable atomic hydrogen dose levels are in the range of about 2×$10^{12}$/cm$^2$ to about 2×$10^{14}$/cm$^2$. A suitable temperature range for the anneal following implant is believed to be about 300° C. to about 550° C., though lower and higher temperatures might also yield acceptable results.

Figure 5:
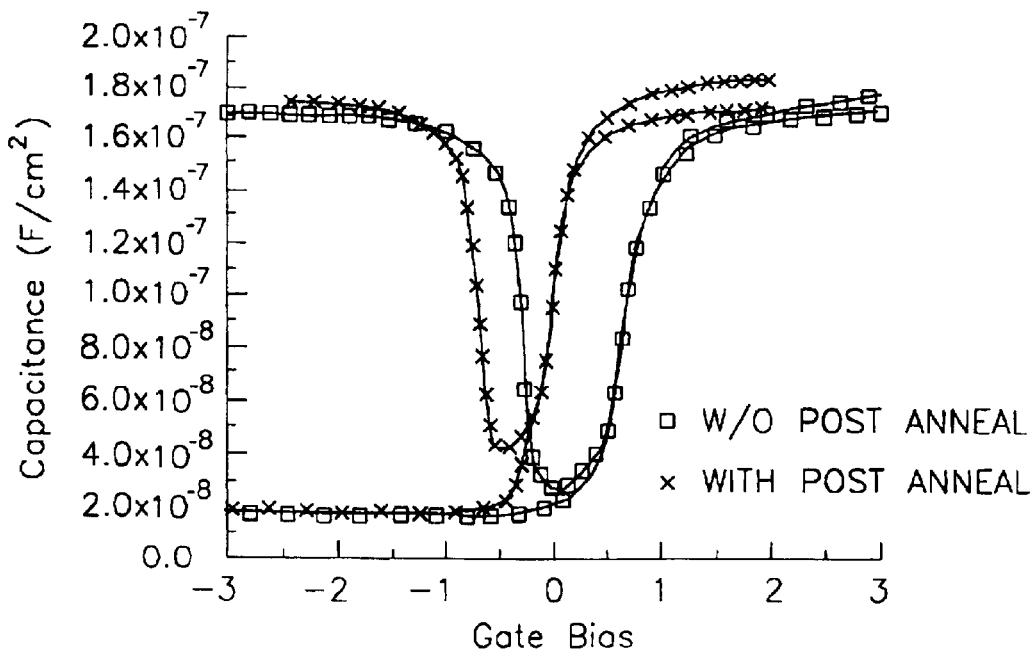
FIGS. 5 and 6 are plots of C-V data collected from MOS devices passivated by hydrogen plasma in accordance with a third embodiment of this invention.
Figure 6:
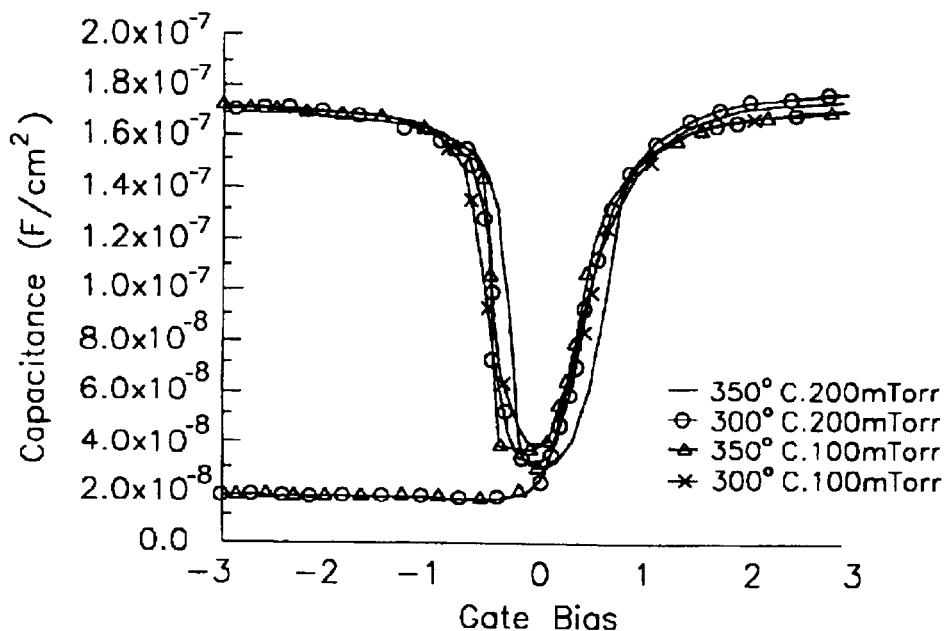

In the second test, atomic hydrogen was generated by a treatment with hydrogen plasma. Samples were again tungsten electrode MOS capacitors identical to those of the implantation investigation, i.e., 100 nm CVD tungsten defined by conventional photolithography and without an aluminum layer. The plasma was created using a single frequency microwave cavity in accordance with Cartier et al., Appi. Phys. Lett., Volume 63, No. 11, pp. 1510 (1993), and brought directly to the samples in a vacuum chamber. In a first procedure, it was shown that a room temperature hydrogen plasma treatment plus a post anneal at 350° C. was not sufficient to introduce atomic hydrogen into the Si/SiO$_2$ interface of the MOS capacitors. In another procedure, a hydrogen plasma treatment was conducted with samples maintained at about 350° C. whereby the efficiency of hydrogen introduction to the Si/SiO$_2$ interface was greatly improved, as evidenced by the interface state density being reduced to about 3.5×$10^{10}$/cm$^2$-eV. However, further post anneals at higher temperatures, such as 400° C., was found to deteriorate the passivation, as indicated in FIG. 5. Further plasma treatments were then performed at plasma anneal temperatures of 300° C. and 350° C., and hydrogen flow pressures of 100 and 200 mTorr. C-V data represented in FIG. 6 indicates that the quality of passivation was very sensitive to lower treatment temperatures (300° C.) and lower flow pressures (100 mTorr). The best passivation was produced with hydrogen plasma treatments conducted with a hydrogen flow pressure of about 200 mTorr and a temperature of about 350° C. for a duration of about 10 minutes. However, it is believed that suitable results could be obtained with plasma treatment temperatures between 250° C. and 400° C., and with a hydrogen flow pressure of about 10 mTorr to about 1000 mTorr.

Figure 7:
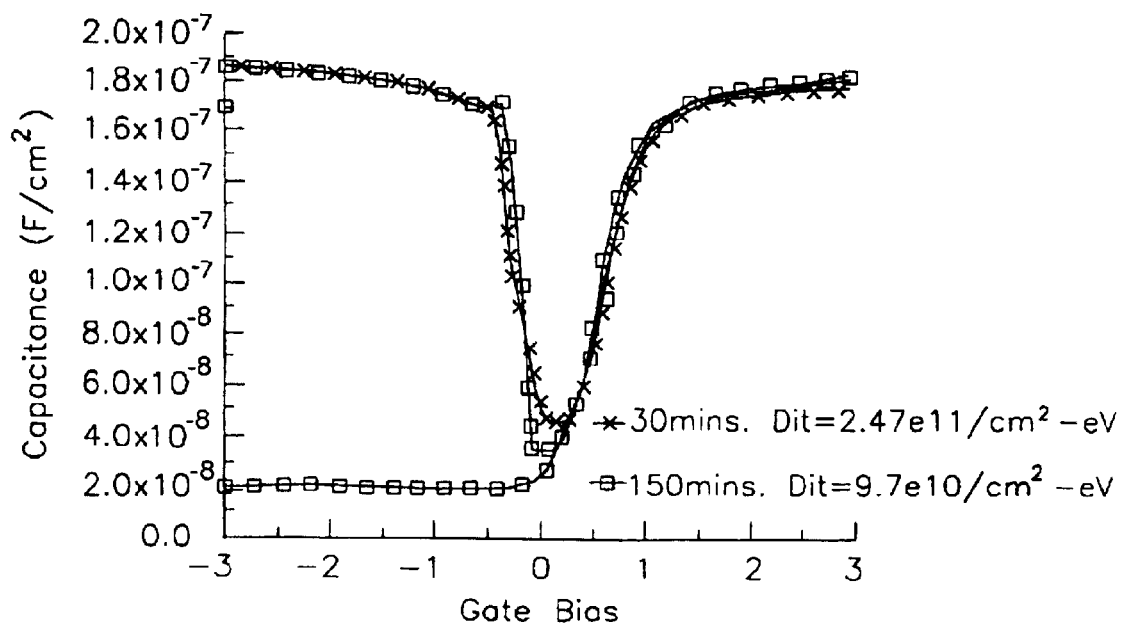
FIG. 7 is a plot of C-V data collected from MOS devices with very thin tungsten layers and passivated in accordance with the prior art.

In a final investigation, the ability of molecular hydrogen to diffuse through very thin layers of tungsten was evaluated. This investigation was pursued to determine whether the role of tungsten in preventing passivation performed under conventional FGA conditions is simply as a diffusion barrier to molecular hydrogen. For the investigation, MOS capacitors were prepared identically to those prepared for the previously described investigations, with the exception that the tungsten electrodes had thicknesses of 20 nm. The samples then received either a 30 minute or a 150 minute FCA treatment at about 350° C. The C-V data for two specimens are plotted in FIG. 7, which clearly shows that the Si/SiO$_2$ interfaces of both samples were passivated, with those samples receiving the longer FGA treatment receiving the better passivation. The interface state density measured on the sample annealed for 150 minutes was reduced to about 9.5×$10^{10}$/cm$^2$-eV. In contrast to those earlier samples with a thick (100 nm) tungsten electrode, the improvements in passivation exhibited by these MOS devices when subjected to long and low temperature FGA treatments suggested that the diffusion of molecular hydrogen through a tungsten layer is possible if the tungsten layer is sufficiently thin (e.g., about 20 nm or less).

In summary, the present invention demonstrated that a relatively thick (above 20 nm, e.g., about 100 nm) tungsten electrode prevents passivation of an underlying Si/SiO$_2$ interface by conventional FGA treatments, because the electrode is impermeable to molecular hydrogen (though relatively thinner (20 nm) tungsten electrodes may allow passivation by conventional FGA). However, passivation is achieved with thick tungsten electrodes if hydrogen is available in atomic form, such as by implantation into the tungsten electrode or from a source of atomic hydrogen such as hydrogen plasma or the aluminum layer of an aluminum-tungsten electrode stack. It is believed that further optimization can be achieved through enhancements to the annealing process and a fuller understanding of the reaction kinetics relating to the complex interplay between the diffusivity of different species of hydrogen and surface reaction rates. Nevertheless, the present invention evidences that passivation of a Si/SiO$_2$ interface of a MOS device through a tungsten electrode can be achieved.

It is believed that the above investigations suggest that passivation of other semiconductor-dielectric interfaces may be possible through other metal electrodes that are impermeable to molecular hydrogen. Furthermore, while a particular MOS device 10 is represented in FIG. 1, those skilled in the art will appreciate that the invention is applicable to various other MOS devices, including advanced MOS devices with with sidewalls that might prevent hydrogen gas diffusion into the semiconductor-dielectric interface. Accordingly, while the invention has been described in terms of a preferred embodiment, it is apparent that other forms could be adopted by one skilled in the art. Therefore, the scope of the invention is to be limited only by the following claims.

What is claimed is:

1. A process of passivating the semiconductor-dielectric interface of a MOS structure, the process comprising the steps of:

forming a layer of dielectric material on a semiconductor substrate so as to form an interface between the substrate and the dielectric layer;

forming an electrode on the dielectric layer to form a MOS structure, the electrode comprising a metallic layer that renders the electrode substantially impervious to molecular hydrogen if the metallic layer has a first thickness, the metallic layer being formed to have a second thickness that is sufficiently less than the first thickness to render the electrode pervious to molecular hydrogen; and then exposing the MOS structure to molecular hydrogen so as to diffuse molecular hydrogen through the electrode and the metallic layer and into the interface so as to passivate the interface.

2. A process according to claim 1, wherein the dielectric material is silicon dioxide.

3. A process according to claim 2, wherein the dielectric layer has a thickness of up to 20 nm.

4. A process according to claim 1, wherein the substrate is silicon.

5. A process according to claim 1, wherein the metallic layer is a material chosen from the group consisting of tungsten, tungsten silicide, cobalt silicide, and tantalum nitride.

6. A process according to claim 5, wherein the metallic layer is tungsten and formed by chemical vapor deposition using W(CO)$_6$ as a source material.

7. A process according to claim 5, wherein the metallic layer is tungsten, the first thickness is about 100 nm or more, and the second thickness is about 20 nm or less.

8. A process according to claim 1, wherein the interface has an interface state density of less than 5×10$^{10}$/cm$^2$–eV.

9. A process of passivating the semiconductor-dielectric interface of a MOS structure, the process comprising the steps of:

forming a layer of dielectric material on a semiconductor substrate so as to form an interface between the substrate and the dielectric layer;

forming a metallic layer on the dielectric layer to form a MOS structure, the metallic layer being pervious to atomic hydrogen; and then exposing the MOS structure to atomic hydrogen so as to diffuse atomic hydrogen through the metallic layer and into the interface, wherein the exposing step comprises forming an aluminum layer on the metallic layer in the presence of hydrogen to store atomic hydrogen between the metallic and aluminum layers, and then annealing the MOS structure at a temperature sufficient to cause the atomic hydrogen to diffuse through the metallic layer and into the interface.

10. A process according to claim 9, wherein the metallic layer is a material chosen from the group consisting of tungsten, tungsten silicide, cobalt silicide, and tantalum nitride.

11. A process according to claim 9, wherein the metallic layer is tungsten and has a thickness of greater than 20 nm.

12. A process according to claim 11, wherein the metallic layer has a thickness of at least about 100 nm.

13. A process of passivating the semiconductor-dielectric interface of a MOS structure, the process comprising the steps of:

forming a dielectric layer of silicon dioxide on a silicon substrate so as to form an interface between the substrate and the dielectric layer, the dielectric layer having a thickness of up to 5 nm;

forming a tungsten layer having a thickness of greater than 20 nm on the dielectric layer to form a MOS structure, the tungsten layer being pervious to atomic hydrogen but not molecular hydrogen; and then forming an aluminum layer on the tungsten layer in the presence of hydrogen to store atomic hydrogen between the tungsten and aluminum layers, and then heating the MOS structure to diffuse a sufficient amount of atomic hydrogen through the tungsten layer and into the interface to yield an interface state density of less than 5×10$^{10}$/cm$^2$–eV.

14. A process according to claim 13, wherein the heating step comprises annealing the MOS structure at a temperature of about 250° C. to about 400° C. to cause the atomic hydrogen to diffuse through the tungsten layer and into the interface.

15. A process according to claim 13, wherein the tungsten layer is formed to have a thickness of about 100 nm or more.

16. A process according to claim 13, wherein the heating step is carried out in an inert atmosphere.

17. A process according to claim 13, wherein the MOS structure is formed to comprise an electrode that consists of the tungsten and aluminum layers.

18. A process according to claim 13, wherein the tungsten layer is formed by chemical vapor deposition using W(CO)$_6$ as a source material.

19. A process according to claim 13, wherein the MOS structure is a MOSFET and the tungsten layer is a gate electrode of the MOSFET.

20. A process according to claim 19, wherein the gate electrode has a gate length of less than 0.01 micrometer.

* * * * *